United States Patent
Iguchi et al.

(10) Patent No.: US 10,116,261 B2
(45) Date of Patent: Oct. 30, 2018

(54) OSCILLATOR CIRCUIT

(71) Applicant: KABUSHIKI KAISHA TOSHIBA, Minato-ku (JP)

(72) Inventors: Shunta Iguchi, Tokyo (JP); Makoto Takamiya, Tokyo (JP); Takayasu Sakurai, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 144 days.

(21) Appl. No.: 15/256,034

(22) Filed: Sep. 2, 2016

(65) Prior Publication Data
US 2017/0201216 A1    Jul. 13, 2017

(30) Foreign Application Priority Data
Jan. 12, 2016    (JP) ................................. 2016-003356

(51) Int. Cl.
| H03B 7/00 | (2006.01) |
| H03B 5/24 | (2006.01) |
| H03B 5/32 | (2006.01) |
| H03B 5/36 | (2006.01) |

(52) U.S. Cl.
CPC ............... *H03B 7/00* (2013.01); *H03B 5/24* (2013.01); *H03B 5/32* (2013.01); *H03B 5/364* (2013.01)

(58) Field of Classification Search
CPC .................................................. H03B 7/00
USPC ....................................................... 331/115
See application file for complete search history.

(56) References Cited

U.S. PATENT DOCUMENTS

| 2003/0210101 A1* | 11/2003 | McCorquodale ... H01F 17/0006 331/117 FE |
| 2008/0157889 A1* | 7/2008 | Yu ........................... H03B 5/04 331/1 R |
| 2010/0188163 A1 | 7/2010 | Goto et al. |

FOREIGN PATENT DOCUMENTS

| JP | 11-127032 A | 5/1999 |
| JP | 2001-257534 A | 9/2001 |
| JP | 2010-178026 A | 8/2010 |

OTHER PUBLICATIONS

Y. Chang, et al. "A Differential Digitally Controlled Crystal Oscillator With a 14-Bit Tuning Resolution and Sine Wave Outputs for Cellular Applications", IEEE Journal of Solid-State Circuits, vol. 47, No. 2, 2012, 14 pages.

D. Griffith, et al. "A 65nm CMOS DCXO System for Generating 38.4MHz and a Real Time Clock from a Single Crystal in 0.09mm$^2$", 2010 IEEE Radio Frequency Integrated Circuits Symposium, 2010, 4 pages.

* cited by examiner

*Primary Examiner* — Joseph Chang
(74) *Attorney, Agent, or Firm* — Oblon, McClelland, Maier & Neustadt, L.L.P.

(57) ABSTRACT

According to one embodiment, an oscillator circuit includes a resonant circuit and first and second negative-resistance circuits. Each of the first and second negative-resistance circuits includes a first power-supply terminal, a second power-supply terminal, an input terminal and an output terminal. The first and second negative-resistance circuits are connected in series between a first power supply and a second power supply at the first and second power-supply terminals, and connected parallel to the resonance circuit at the input and output terminals.

18 Claims, 6 Drawing Sheets

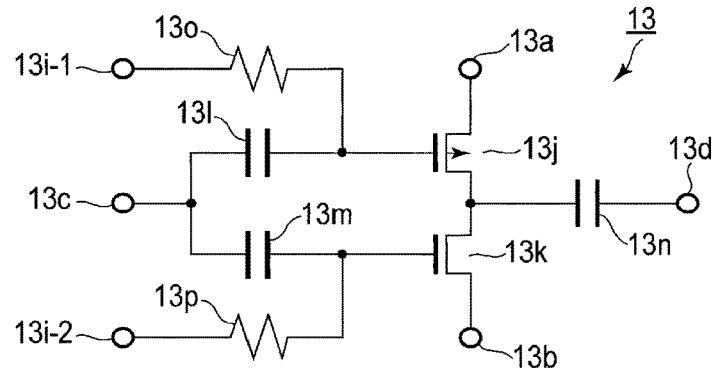
F I G. 5
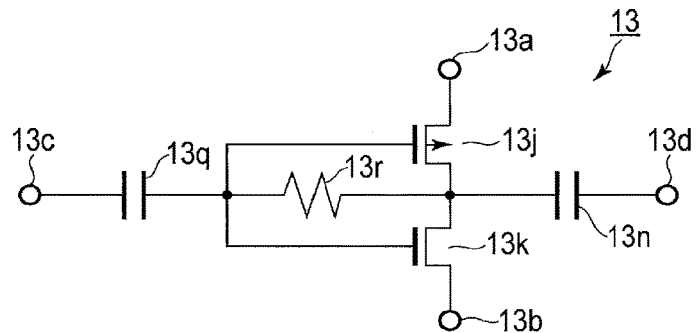
F I G. 6
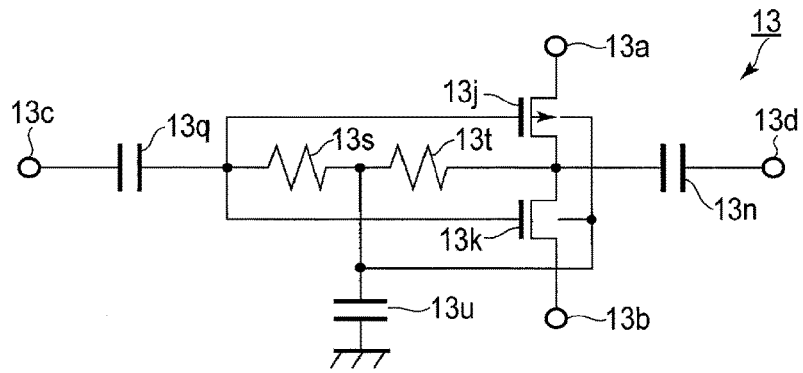
F I G. 7

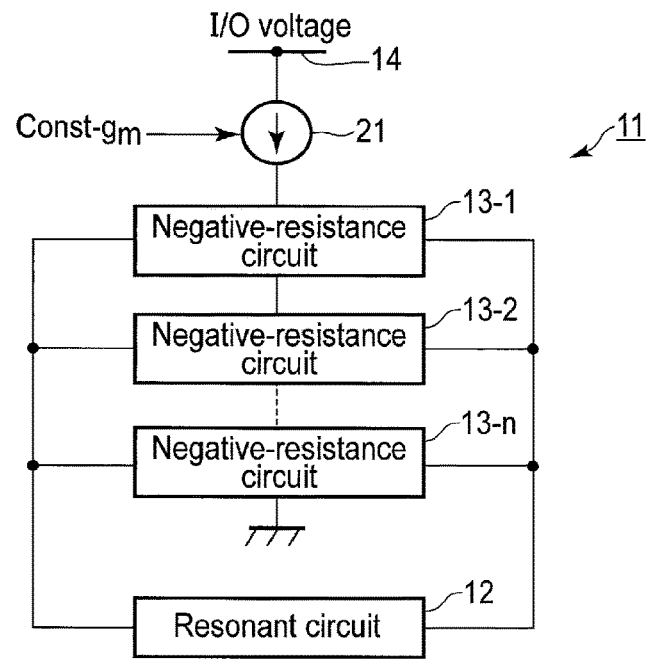
F I G. 9
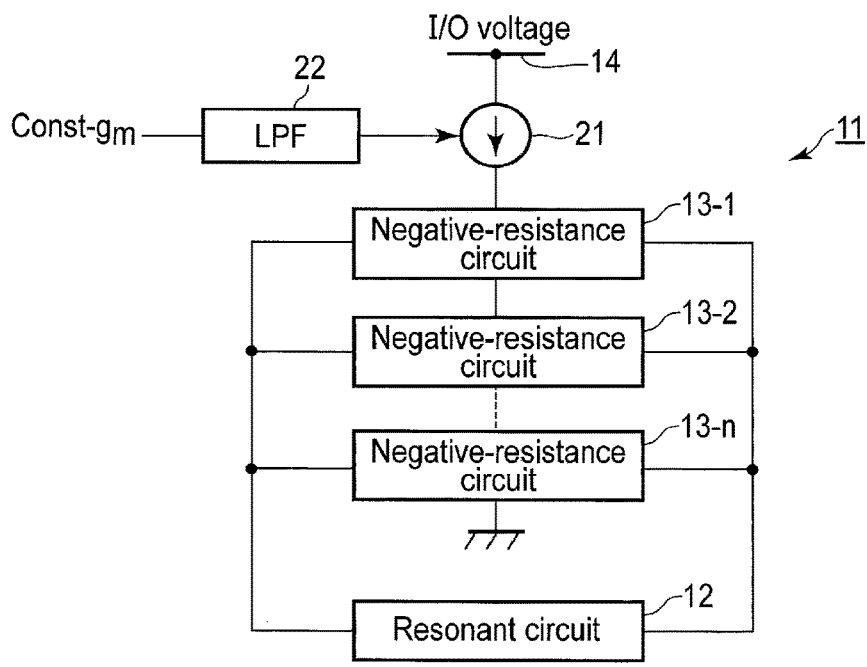
F I G. 10

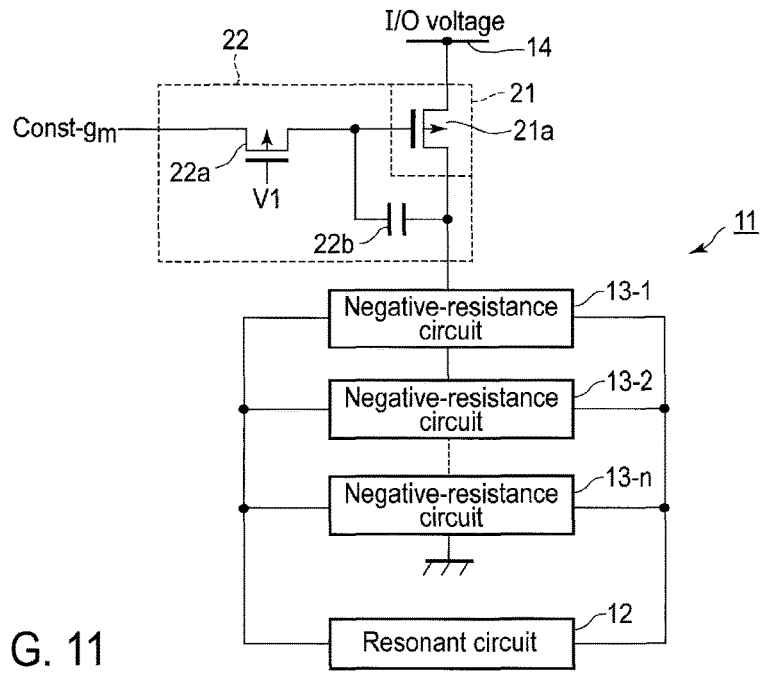
F I G. 11
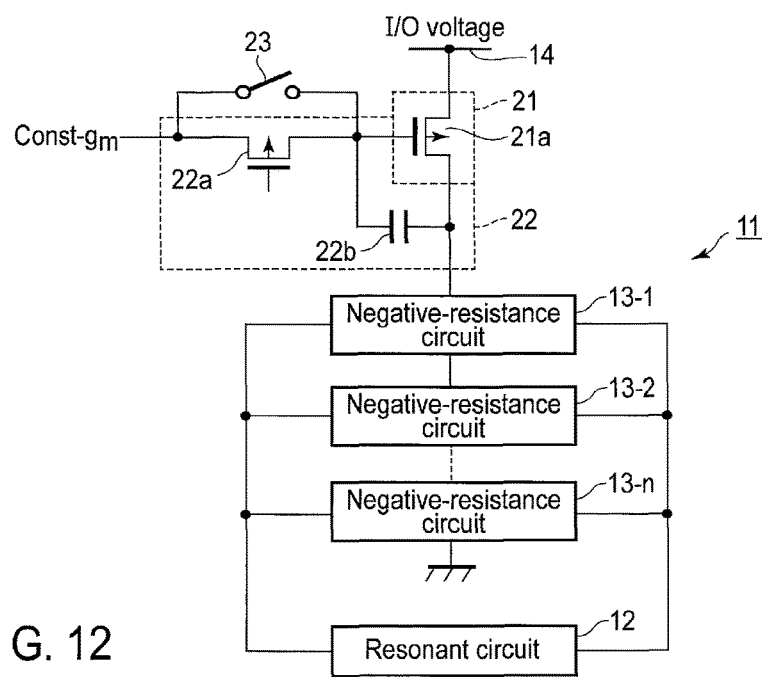
F I G. 12

OSCILLATOR CIRCUIT

CROSS-REFERENCE TO RELATED APPLICATIONS

This application is based upon and claims the benefit of priority from Japanese Patent Application No. 2016-003356, filed Jan. 12, 2016, the entire contents of which are incorporated herein by reference.

FIELD

Embodiments described herein relate generally to an oscillator circuit provided in, for example, a semiconductor integrated circuit.

BACKGROUND

An oscillator circuit provided in, for example, a semiconductor integrated circuit continues to operate even if a system incorporating the semiconductor integrated circuit is on standby. Since the total power consumption of the system depends on the power consumption of the oscillator circuit, it is necessary to reduce the power consumption of the oscillator circuit in order to reduce the power consumed while the system is on standby.

In general, in many cases, an oscillator circuit is designed as part of a semiconductor integrated circuit. Also, it should be noted that semiconductor integrated circuits have been scaled down, and according to, for example, design rules for 65 nm, I/O voltage $V_{DDI/O}$ for driving input-output pins of each of semiconductor integrated circuits is, for example, 1.8 to 3.6 V.

In order that the power consumption of the oscillator circuit is reduced, the oscillator circuit is designed according to design rules for transistors in a core portion of a semiconductor integrated circuit. A drive voltage for the transistors in the core portion is, for example, 1.2 V which is lower than I/O voltage $V_{DDI/O}$. Thus, I/O voltage $V_{DDI/O}$ is lowered to 1.2 V by a step-down circuit.

BRIEF DESCRIPTION OF THE DRAWINGS

FIG. 5 is a circuit diagram illustrating a first modification of the negative-resistance circuit.

FIG. 6 is a circuit diagram illustrating a second modification of the negative-resistance circuit.

FIG. 7 is a circuit diagram illustrating a third modification of the negative-resistance circuit.

FIG. 9 is a configuration view illustrating an example of an oscillator circuit according to a second embodiment.

FIG. 10 is a configuration view illustrating a first modification of the second embodiment.

FIG. 11 is a circuit diagram illustrating an example of a low-pass filter as shown in FIG. 10.

FIG. 12 is a configuration view illustrating a second modification of the second embodiment.

DETAILED DESCRIPTION

Figure 1:
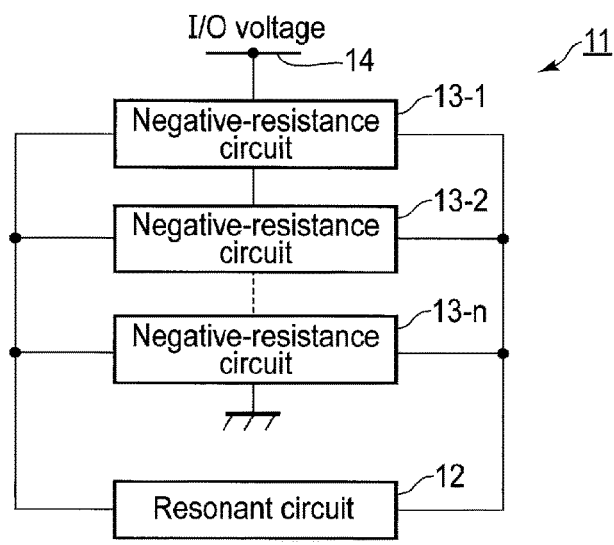
FIG. 1 is a configuration view illustrating an example of an oscillator circuit according to a first embodiment.

In general, according to one embodiment, an oscillator circuit includes a resonant circuit and first and second negative-resistance circuits. Each of the first and second negative-resistance circuits includes a first power-supply terminal, a second power-supply terminal, an input terminal and an output terminal. The first and second negative-resistance circuits are connected in series between a first power supply and a second power supply at the first and second power-supply terminals, and connected parallel to the resonance circuit at the input and output terminals.

Various embodiments will be described hereinafter with reference to the accompanying drawings. In the specification and the drawings, with respect to each of the embodiments, structural elements identical to those in the other embodiments will respectively be denoted by the same reference numerals as in the other embodiments, and after they are each explained once, their explanations will be omitted.

(First Embodiment)

FIG. 1 shows an oscillator circuit 11 according to the first embodiment. The oscillator circuit 11 is implemented on, for example, a semiconductor integrated circuit (not shown), and designed according to design rules for transistors in a core portion of the semiconductor integrated circuit. The transistors of the core portion are driven at a voltage lower than I/O voltage $V_{DDI/O}$ (for example, 1.8 to 3.6 V); e.g., they are driven at 1.2 V. Unlike a conventional technique, without using a step-down circuit, the oscillator circuit 11 according to the first embodiment generates from an I/O voltage a voltage lower than the I/O voltage, and is driven at the voltage lower than the I/O voltage.

Referring to FIG. 1, the oscillator circuit 11 includes a resonant circuit 12 and negative-resistance circuits 13-1, 13-2, ..., 13-n. For example, negative-resistance circuits 13-1, 13-2, ..., 13-n have the same structure; however, they may have different structures. Current paths (not shown) of negative-resistance circuits 13-1, 13-2, ..., 13-n are connected in series between an interconnect 14 supplied with an I/O voltage and the ground. To be more specific, negative-resistance circuits 13-1, 13-2, ..., 13-n are vertically stacked between the interconnect 14 and the ground. Input terminals and output terminals of negative-resistance circuits 13-1, 13-2, ..., 13-n are connected parallel to the resonant circuit 12.

The current paths of n negative-resistance circuits, i.e., negative-resistance circuits 13-1, 13-2, ..., 13-n, are connected in series between the interconnect 14 supplied with an I/O voltage and the ground, and a predetermined DC bias voltage is supplied to each of negative-resistance circuits 13-1, 13-2, ..., 13-n, whereby as described later, the I/O voltage can be reduced to 1/n. The resonant circuit 12 is driven by the I/O voltage reduced to 1/n.

Figure 2:
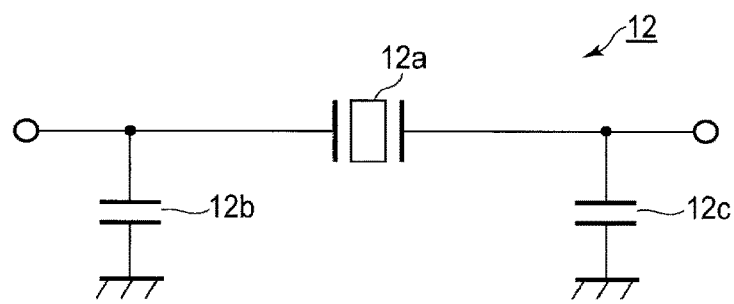
FIG. 2 is a circuit diagram illustrating an example of the oscillator circuit as shown in FIG. 1.

FIG. 2 shows an example of the resonant circuit 12. The resonant circuit 12 includes a crystal oscillator 12a and capacitors 12b and 12c. One end of the crystal oscillator 12a is grounded through the capacitor 12b, and the other end of the crystal oscillator 12a is grounded through the capacitor 12c. Also, the above one end of the crystal oscillator 12a is connected to the input terminals of negative-resistance circuits 13-1, 13-2, ..., 13-n as illustrated in FIG. 1, and the above other end of the crystal oscillator 12a is connected to the output terminals of negative-resistance circuits 13-1, 13-2, ..., 13-n.

The structure of the resonant circuit 12 is not limited to the above, and can be modified. Also, it is possible to apply not only a resonant circuit including a crystal oscillator, but a resonant circuit including, for example, an LC circuit.

Figure 3:
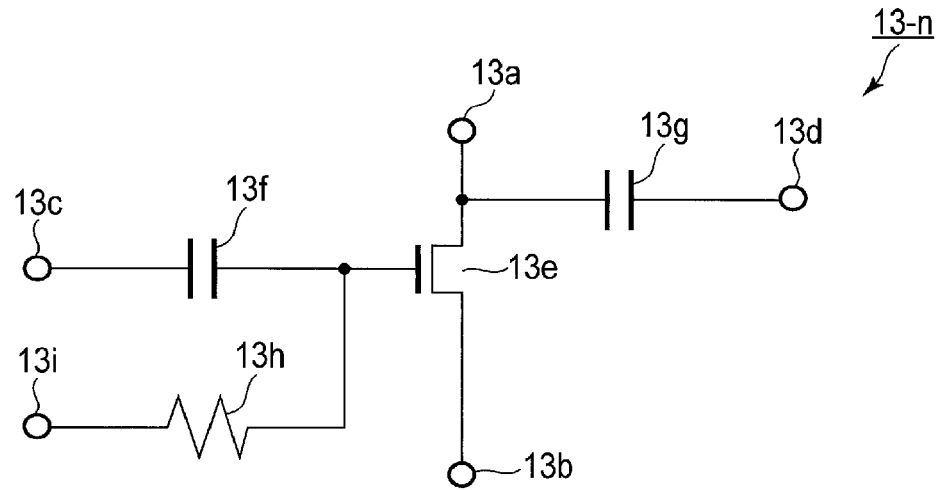
FIG. 3 is a circuit diagram illustrating an example of a negative-resistance circuit as shown in FIG. 1.

FIG. 3 shows negative-resistance circuit 13-$n$ as a typical example of negative-resistance circuits 13-1, 13-2, . . . , 13-$n$.

Negative-resistance circuit 13-$n$ includes, for example, first power-supply terminal 13$a$, second power supply terminal 13$b$, input terminal 13$c$, output terminal 13$d$, N-channel MOS transistor (hereinafter referred to as NMOS) 13$e$, DC-cut capacitors 13$f$ and 13$g$, bias resistance 13$h$ and bias terminal 13$i$.

NMOS 13$e$ includes a current path and a gate electrode. One end of the current path of NMOS 13$e$ is connected to first power supply terminal 13$a$, and the other is connected to second power supply terminal 13$b$. Capacitor 13$f$ is connected between input terminal 13$c$ and the gate electrode of NMOS 13$e$, and bias resistance 13$h$ is connected between bias terminal 13$i$ and the gate electrode of NMOS 13$e$. Capacitor 13$g$ is connected between output terminal 13$d$ and first power supply terminal 13$a$.

First power supply terminal 13$a$ of negative-resistance circuit 13-1, as shown in FIG. 1, is connected to the interconnect 14 supplied with an I/O voltage, and first power supply terminal 13$a$ of negative-resistance circuit 13-2 is connected to second power supply terminal 13$b$ of negative-resistance circuit 13-1. First power supply terminal 13$a$ of negative-resistance circuit 13-$n$ is connected to second power supply terminal 13$b$ of negative-resistance circuit 13-$n$-1 (not shown), and second power supply terminal 13$b$ of negative-resistance circuit 13-$n$ is grounded. Therefore, current paths of NMOSs 13$e$ included in negative-resistance circuits 13-1, 13-2, . . . 13-$n$ are connected in series between the interconnect 14 supplied with an I/O voltage and the ground.

Input terminals 13$c$ of negative-resistance circuits 13-1, 13-2, . . . , 13-$n$ are connected to one of the ends of the resonant circuit 12, and output terminals 13$d$ of negative-resistance circuits 13-1, 13-2, . . . , 13-$n$ are connected to the other end of the resonant circuit 12. Thus, negative-resistance circuits 13-1, 13-2, . . . , 13-$n$ are connected parallel to the resonant circuit 12.

Bias terminals 13$i$ of negative-resistance circuits 13-1, 13-2, . . . , 13-$n$ are given, for example, different DC bias voltages. The DC bias voltages are, for example, voltages which are intermediate between voltages at first power supply terminals 13$a$ of negative-resistance circuits 13-1, 13-2, . . . , 13-$n$ and voltages at second power supply terminals 13$b$ thereof.

Figure 4:
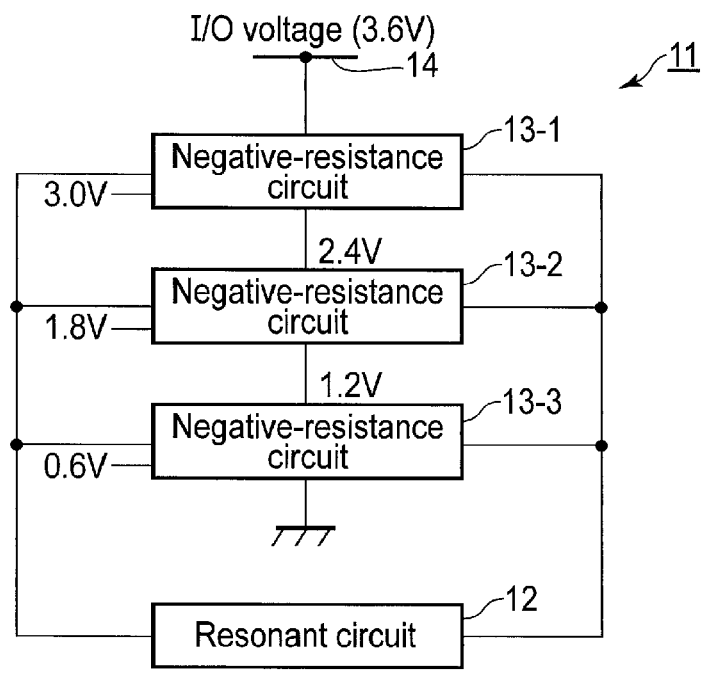
FIG. 4 is a configuration view for explaining an operation of the first embodiment.

FIG. 4 is a view for explaining an operation of the first embodiment, and illustrates the case where three negative-resistance circuits 13-1, 13-2 and 13-3 are used. These three negative-resistance circuits can reduce, for example, an I/O voltage of 3.6 V to 1.2 V which is ⅓ of 3.6 V.

Specifically, in the case where NMOSs 13$e$ of negative-resistance circuits 13-1, 13-2 and 13-3 all have the same threshold voltage, each of the negative-resistance circuits reduces the I/O voltage by 1.2 V. That is, the I/O voltage is reduced from 3.6 V to 2.4 V by negative-resistance circuit 13-1, and then from 2.4 V to 1.2 V by negative-resistance circuit 13-2. In this case, a bias voltage for each of negative-resistance circuits 13-1, 13-2 and 13-3 is set to a voltage which is intermediate between a voltage at first power supply terminal 13$a$ of each of the negative-resistance circuits and a voltage at second power supply terminal 13$b$ of each negative-resistance circuit.

More specifically, the bias voltage for negative-resistance circuit 13-1 is 3.0 V which is intermediate between 3.6 V and 2.4 V; the bias voltage for negative-resistance circuit 13-2 is 1.8 V which is intermediate between 2.4 V and 1.2 V; and the bias voltage for negative-resistance circuit 13-3 is 0.6 V which is intermediate between 1.2 V and ground potential. These bias voltages are supplied to negative-resistance circuits 13-1, 13-2 and 13-3, respectively, whereby the I/O voltage of 3.6 V can be reduced to 1.2 V which is a voltage at the core portion.

It should be noted that in the case where four or more negative-resistance circuits are provided, the method of setting bias voltages for the negative-resistance circuits is the same as described above; however, the threshold voltage of NMOS 13$e$ included in each of the negative-resistance circuits needs to be less than the difference between the potentials of the gate and source of NMOS 13$e$.

Furthermore, as described later, in negative-resistance circuit 13-3 (13-$n$) of the negative-resistance circuits which is the closest to the ground, DC-cut capacitors 13$f$ and 13$g$ are omitted in order to set the DC level of the output of the oscillator circuit 11.

In addition, in negative-resistance circuits 13-1, 13-2 and 13-3, which are given the above bias voltages, the current paths of NMOSs 13$e$ are connected in series. Thus, current flowing in negative-resistance circuit 13-1 is re-used by negative-resistance circuit 13-2 and negative-resistance circuit 13-3. Therefore, the power consumption can be reduced to $1/n^2$ (n is the number of negative-resistance circuits). That is, in the example illustrated in FIG. 4, the power consumption can be reduced to $⅓^2=⅑$.

According to the oscillator circuit 11 shown in the first embodiment, bias voltages which are intermediate between voltages at first power supply terminals 13$a$ of negative-resistance circuits 13-1, 13-2, . . . 13-$n$ and those at second power supply terminals 13$b$ of negative-resistance circuits 13-1, 13-2, . . . , 13-$n$ are supplied to the gate electrodes of NMOSs 13$e$ which are included in negative-resistance circuits 13-1, 13-2, . . . , 13-$n$ and whose current paths are connected in series. It is therefore possible to generate a voltage to which the I/O voltage is reduced by the number of negative-resistance circuits, without using a step-down circuit.

In addition, by applying the negative-resistance circuits whose current paths are connected in series, the power consumption can be reduced to 1/(number of negative-resistance circuits)$^2$. Therefore, it is possible to achieve an oscillator circuit that uses less power than an oscillator circuit employing a step-down circuit.

Furthermore, the transistors included in negative-resistance circuits 13-1, 13-2, . . . , 13-$n$ can be manufactured according to the same design rules as the transistors in the core portion. Thus, the oscillator circuit 11 including negative-resistance circuits 13-1, 13-2, . . . , 13-$n$ can be made smaller.

(First Modification of Negative-resistance Circuit)

FIG. 5 shows a first modification of each of the negative-resistance circuits. In the first embodiment, the negative-resistance circuits employ NMOSs. By contrast, in the first modification, for example, complementary negative-resistance circuits are provided.

As illustrated in FIG. 5, a negative-resistance circuit 13 includes P-channel MOS transistor (hereinafter referred to as PMOS) 13$j$, NMOS 13$k$, DC-cut capacitors 13$l$, 13$m$ and 13$n$, bias resistors 13$o$ and 13$p$ and bias terminals 13$i$-1 and 13$i$-2.

PMOS 13j includes a current path and a gate electrode. Current paths of PMOS 13j and NMOS 13k are connected in series between first power supply terminal 13a and second power supply terminal 13b. Capacitor 13l is connected between input terminal 13c and the gate electrode of PMOS 13j, and capacitor 13m is connected between input terminal 13c and the gate electrode of NMOS 13k. Bias resistor 13o is connected between bias terminal 13i-1 and the gate electrode of PMOS 13j, and bias resistor 13p is connected between bias terminal 13i-2 and the gate electrode of NMOS 13k. Capacitor 13n is connected between output terminal 13d and a connection node between PMOS 13j and NMOS 13k.

A voltage which is intermediate between the voltage at first power supply terminal 13a and that at second power supply terminal 13b is supplied to bias terminals 13i-1 and 13i-2.

According to the above, a negative-resistance circuit can be formed to employ a CMOS inverter circuit comprising PMOS 13j and NMOS 13k. By forming a circuit as shown in FIG. 1 or 4 using negative-resistance circuits 13 according to the first modification, it can obtain the same advantage as in the first embodiment.

(Second Modification of Negative-resistance Circuit)

The negative-resistance circuits as shown in FIGS. 3 and 5 need bias voltages generated separately with the I/O voltage. By contrast, in the second modification, self-bias type negative-resistance circuits are provided.

FIG. 6 illustrates the second modification of each of the negative-resistance circuits. Capacitor 13q is connected between input terminal 13c and a connection node to which the gate electrodes of PMOS 13j and NMOS 13k are connected. Bias resistor 13r is connected between the connection node of the gate electrodes of PMOS 13j and NMOS 13k and the connection node of the current paths of PMOS 13j and NMOS 13k.

According to the second modification, by using one bias resistor 13r, a voltage which is intermediate between the voltage at first power supply terminal 13a and that at second power supply terminal 13b can be supplied to the gate electrode of PMOS 13j and the gate electrode of NMOS 13k. Thus, it is not necessary to provide a circuit for generating a bias voltage. Therefore, the circuit structure can be simplified.

By forming a circuit as shown in FIG. 1 or 4 using negative-resistance circuits 13 according to the second modification, it can obtain the same advantage as in the first embodiment.

(Third Modification of Negative-resistance Circuit)

As shown in FIG. 4, in the case where current paths of a plurality of negative-resistance circuits are connected in series, the greater the number of negative-resistance circuits, the lower the voltage between the gate and source of an NMOS (and a PMOS) in each of the negative-resistance circuits. For example, if the number of negative-resistance circuits is three, the voltage between the gate and source of the NMOS (and the PMOS) included in each of the negative-resistance circuits is 0.6 V; and if the number of negative-resistance circuits is four, the voltage between the gate and source of the NMOS included in each of the negative-resistance circuits is 0.45 V. For example, if the threshold voltage of the NMOS is 0.6 V, and the voltage between the gate and source of the NMOS is 0.45 V, the NMOS becomes unable to operate. The same is true of the PMOS. Also, in the case where the number of negative-resistance circuits is small, if the I/O voltage is reduced, the NMOS and the PMOS become unable to operate.

In order to avoid the above, in the third modification, self-bias type negative-resistance circuits are formed capable of controlling a back-gate bias for each of the NMOS and PMOS.

FIG. 7 illustrates the third modification. Bias resistors 13s and 13t are connected in series between the connection node of the gate electrode of PMOS 13j and the gate electrode of NMOS 13k and the connection node of PMOS 13j and NMOS 13k. Capacitor 13u is connected between a connection node between bias resistors 13s and 13t and the ground. Furthermore, the voltage at the connection node between bias resistors 13s and 13t is supplied to a back gate (an n-type well region (not shown)) of PMOS 13j and a back gate (a p-type well region (not shown)) of NMOS 13k. Thus, a positive back-gate bias voltage is supplied to PMOS 13j and NMOS 13k. Therefore, the threshold voltages of PMOS 13j and NMOS 13k are lowered. The back-gate bias voltage is equal to a gate bias voltage which is supplied to the gate electrodes of PMOS 13j and NMOS 13k, i.e., it is a voltage which is intermediate between the voltage at first power supply terminal 13a and that at second power supply terminal 13b.

According to the third modification, in each of the self-bias type negative-resistance circuits, part of a gate-bias voltage generated by bias resistors 13s and 13t is supplied as a back-gate bias voltage, to thereby control the threshold voltages of PMOS 13j and NMOS 13k included in each negative-resistance circuit. Thus, PMOS 13j and NMOS 13k included in each negative-resistance circuit can be driven at a low voltage; and in the case where a plurality of negative-resistance circuits are vertically stacked together, or even in the case where the I/O voltage is lowered, each negative-resistance circuit can be reliably operated.

(Fourth Modification of Negative-resistance Circuit)

Figure 8:
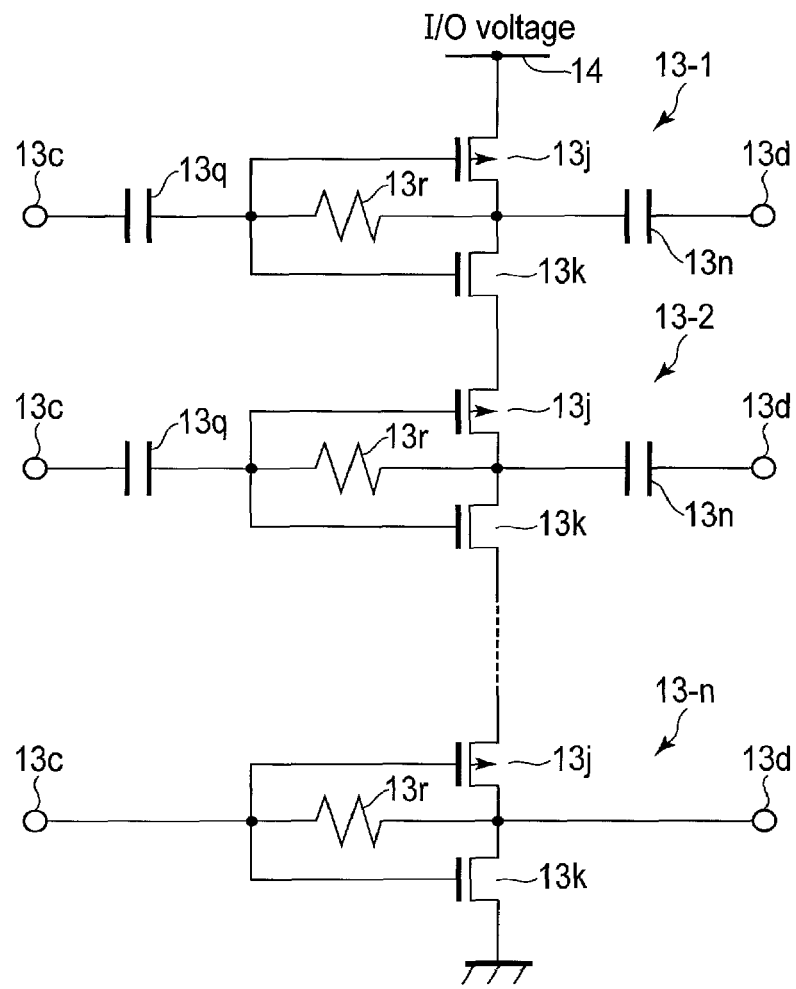
FIG. 8 is a circuit diagram illustrating a fourth modification of the negative-resistance circuit.

FIG. 8 shows the case where a plurality of self-bias type negative-resistance circuits each shown in FIG. 6 are provided, and current paths of the negative-resistance circuits are connected in series. To be more specific, between an interconnect 14 supplied with an I/O voltage and the ground, negative-resistance circuits 13-1, 13-2, . . . , 13-n are vertically stacked together. In this case, DC-cut capacitors 13q and 13n are omitted from an arbitrary one of the negative-resistance circuits, whereby the DC-cut level of the output of an oscillator circuit can be set.

In a circuit as shown in FIG. 8, capacitors 13q and 13n are omitted from in negative-resistance circuit 13-n which is the closest to the ground.

As described above, in the case where the negative-resistance circuits are vertically stacked together, it is possible to obtain a step-down voltage having a value obtained by dividing the I/O voltage by the number of negative-resistance circuits. Therefore, the output voltage of negative-resistance circuit 13-n which is the closest to the ground is the lowest. Supposing the error range of the output voltage of each of the negative-resistance circuits is constant, the lower the output voltage, the smaller the error voltage. Therefore, it is preferable that capacitors 13q and 13n be omitted from negative-resistance circuit 13-n which is the closest to the ground.

According to the fourth modification, the DC level of the output of the oscillator circuit can be set by omitting DC-cut capacitors 13q and 13n in an arbitrary one of the negative-resistance circuits vertically stacked together.

(Second Embodiment)

A plurality of negative-resistance circuits vertically stacked together are easily influenced by variances between manufacturing processes, power-supply voltages and temperatures (hereinafter referred to as PVT).

The second embodiment will be explained by referring to an oscillator circuit in which the influence of the variances in the PVT is reduced.

FIG. 9 shows an oscillator circuit 11 according to the second embodiment. An I/O voltage is supplied to the oscillator circuit 11 through a current source 21. To be more specific, the current source 21 is connected to negative-resistance circuit 13-1 and an interconnect 14 supplied with an I/O voltage. The current source 21, as described later, is formed of, for example, a PMOS having a higher withstand voltage than that of, for example, transistors in a core portion of a semiconductor integrated circuit, and the PMOS is controlled based on a control signal Const-$g_m$. The control signal Const-$g_m$ is a signal which has a temperature coefficient, and generated by a bias generating circuit (not shown) which does not have dependence on, for example, the variation of a power-supply voltage. Thus, a constant current is supplied to negative-resistance circuits 13-1, 13-2, . . . , 13-$n$ through the current source 21.

According to the second embodiment, negative-resistance circuits 13-1, 13-2, . . . , 13-$n$ are supplied with an I/O voltage through a current source 21 in which current is controlled constant by the control signal Const-$g_m$. Thus, the oscillator circuit 11 can reduce the influence of the variances in the PVT, and can perform a stable oscillation operation.

(First Modification of Second Embodiment)

FIG. 10 shows a first modification of the second embodiment. In the first modification, a control signal Const-$g_m$ is supplied to the current-source 21 through a low-pass filter (LPF) 22. Thus, noise contained in the control signal Const-$g_m$ can be eliminated by the LPF 22. Therefore, the current source 21 can be further stably operated, and a phase noise of the oscillator circuit 11 can be reduced.

FIG. 11 shows an example of the LPF 22. The LPF 22 comprises PMOS 22a and capacitor 22b. PMOS 22a includes a current path and a gate electrode. One end of the current path of PMOS 22a is supplied with the control signal Const-$g_m$, and the other is connected to the gate electrode of PMOS 21a which forms the current source 21. Voltage V1 which is lower than the control signal Const-$g_m$ is supplied to the gate electrode of PMOS 22a, and PMOS 22a functions as a resistor. One of the electrodes of capacitor 22b is connected to the gate electrode of PMOS 21a, and the other is connected to a connection node between PMOS 21a and negative-resistance circuit 13-1.

As described above, the LPF 22 is comprised of capacitor 22b and PMOS 22a functioning as a resistor. Thus, the LPF can be made small.

(Second Modification of Second Embodiment)

FIG. 12 shows a second modification of the second embodiment. In the second modification, a switch 23 is connected parallel to PMOS 22a included in an LPF 22. The switch 23 is closed at the time of starting the oscillator circuit 11, to thereby turn off the LPF 22. Thus, at the time of starting the oscillator circuit 11, the control signal Const-$g_m$ does not pass through the LPF 22; that is, it is directly supplied to the gate electrode of PMOS 21a. Thereafter, when the oscillator circuit 11 enters a steady state, the switch 23 is opened. As a result, the control signal Const-$g_m$ passes through the LPF 22 and is supplied to the gate electrode of PMOS 21a.

In such a manner, at the time of starting the oscillator circuit 11, the switch 23 is closed to cause the control signal Const-$g_m$ to be directly supplied to the gate electrode of PMOS 21a. Therefore, it is possible to shorten the time required to start the oscillator circuit 11.

Furthermore, at the point of time at which the oscillator circuit 11 enters a steady state, the switch 23 is opened to transmit the control signal Const-$g_m$ to the gate electrode of PMOS 21a through the LPF 22. Thus, noise contained in the control signal Const-$g_m$ can be eliminated by the LPF 22, and the current source 21 can be stably operated. Therefore, it is possible to stabilize the operation of the oscillator circuit 11.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An oscillator circuit comprising:
   a resonant circuit; and
   first and second negative-resistance circuits,
   wherein each of the first and second negative-resistance circuits includes a first power-supply terminal, a second power-supply terminal, an input terminal and an output terminal, and the first and second negative-resistance circuits are connected in series between a first power supply and a second power supply at the first and second power-supply terminals, and connected parallel to the resonance circuit at the input and output terminals, and
   wherein each of the first and second negative-resistance circuits comprises a first transistor of a first conductivity type which includes a first current path and a first gate electrode, the first current path of the first transistor being located between the first power supply terminal and the second power supply terminal, and
   an intermediate voltage is supplied to the first gate electrode of the first transistor, the intermediate voltage is a voltage between a voltage at the first power supply terminal and a voltage at the second power supply terminal.

2. The oscillator circuit according to claim 1, further comprising:
   a first capacitor between the input terminal and the first gate electrode of the first transistor;
   a first resistor including one end and another end, the one end being supplied with the intermediate voltage, and the another end being connected to the first gate electrode of the first transistor; and
   a second capacitor connected between the first power supply terminal and the output terminal.

3. The oscillator circuit according to claim 1, wherein each of the first and second negative-resistance circuits comprises:
   a second transistor of a second conductivity type which includes a second current path and a second gate electrode, one end of the second current path being connected to the first power supply terminal;
   another end of the second current path being connected to one end of the first current path of the first transistor;
   a first capacitor connected between the input terminal and the second gate electrode of the second transistor;

a first resistor including one end and another end, the one end of the first resistor being supplied with an intermediate voltage which is intermediate between a voltage at the first power supply terminal and a voltage at the second power supply terminal, and the another of the first resistor being connected to the second gate electrode of the second transistor;

a second capacitor connected between the input terminal and the first gate electrode of the first transistor;

a second resistor including one end and another end, one end of the second resistor being supplied with the intermediate voltage, and the another end of the second resistor being connected to the first gate electrode of the first transistor; and a third capacitor connected between a first connection node between the first transistor and the second transistor and the output terminal.

4. The oscillator circuit according to claim 1, wherein each of the first and second negative-resistance circuits comprises:

a second transistor of the second conductivity type which includes a second current path and a second gate electrode, one end of the second current path being connected to the first power supply terminal, another end of the second current path being connected to one end of the first current path of the first transistor;

a first capacitor connected between the input terminal and a first connection node between the first gate electrode of the first transistor and the second gate electrode of the second transistor;

a first resistor connected between the first connection node and a second connection node between the first transistor and the second transistor; and a second capacitor between the second connection node and the output terminal.

5. The oscillator circuit according to claim 4, wherein one of the first and second negative-resistance circuits comprises the first transistor, the second transistor and the first resistor, and the first capacitor and the second capacitor are omitted.

6. The oscillator circuit according to claim 1, wherein each of the first and second negative-resistance circuits comprises:

a second transistor of the second conductivity type which includes a second current path and a second gate electrode, one end of the second current path being connected to the first power supply terminal, another end of the second current path being connected to one end of the first current path of the first transistor;

a first capacitor connected between the input terminal and a first connection node between the first gate electrode of the first transistor and the second gate electrode of the second transistor;

first and second resistors connected in series between the first connection node and a second connection node between the first transistor and the second transistor;

a second capacitor connected between the second connection node and the output terminal; and a third capacitor connected between a third connection node between the first and second resistors and the second power supply, and wherein a voltage at the third connection node is supplied to back gates of the first and second transistors.

7. The oscillator circuit according to claim 1, further comprising a current source which is connected to the first power supply, and supplies a constant current to the first and second negative-resistance circuits in accordance with a control signal.

8. The circuit according to claim 7, further comprising a filter which is connected to the current source, and eliminates noise contained in the control signal.

9. The oscillator circuit according to claim 8, wherein the current source comprises a third transistor which includes a third current path and a third gate electrode, one end of the third current path being connected to the first power supply, and the filter comprises:

a fourth transistor of the second conductivity type which includes a fourth current path and a fourth gate electrode, one end of the fourth current path being connected to the third gate electrode of the third transistor, and a fourth capacitor connected between the third gate electrode of the third transistor and another end of the current path of the third transistor.

10. The oscillator circuit according to claim 9, further comprising a switch which is connected to the filter, and turns off the filter at time of starting the oscillator circuit.

11. The oscillator circuit according to claim 1, wherein the resonant circuit is driven by a voltage generated by the first and second negative-resistance circuits, which is lower than a voltage of the first power supply and higher than a voltage of the second power supply.

12. An oscillator circuit comprising:

a first interconnect supplied with a first voltage;

a first negative-resistance circuit which includes a first input terminal, a first output terminal, a first power-supply terminal and a second power-supply terminal, the first power-supply terminal being connected to the first interconnect;

a second negative-resistance circuit which includes a second input terminal, a second output terminal, a third power-supply terminal and a fourth power-supply terminal, the third power-supply terminal being connected to the second power-supply terminal of the first negative-resistance circuit, the fourth power-supply terminal being supplied with a second voltage which is lower than the first voltage; and a resonant circuit which is driven at a voltage which is lower than the first voltage and higher than the second voltage, and wherein the first input terminal and the first output terminal of the first negative-resistance circuit are connected to the resonant circuit, and the second input terminal and the second output terminal of the second negative-resistance circuit are connected to the resonant circuit.

13. The oscillator circuit according to claim 12, wherein the first negative-resistance circuit comprises:

a first transistor of a first conductivity type which includes a first current path and a first gate electrode, the first current path being located between the first power-supply terminal and the second power-supply terminal, the first gate electrode of the first transistor being supplied with a first intermediate voltage which is intermediate between the first voltage at the first power-supply terminal and a voltage at the second power-supply terminal, the second negative-resistance circuit comprises:

a second transistor of the first conductivity type which includes a second current path and a second gate electrode, the second current path being located between the third power-supply terminal and the fourth power-supply terminal, the second gate electrode of the second transistor being supplied with a second intermediate voltage which is intermediate between a voltage at the third power-supply terminal and the second voltage at the fourth power-supply terminal.

14. The oscillator circuit according to claim 13, wherein the first negative-resistance circuit comprises:
a third transistor of the second conductivity type which includes a third current path and a third gate electrode, one end of the third current path being connected to the first power-supply terminal,
another end of the third current path being connected to one end of the first current path of the first transistor:
a first capacitor which is connected between the first input terminal and a first connection node between the first gate electrode of the first transistor and the third gate electrode of the third transistor;
a first resistor which is connected between the first connection node and a second connection node between the first transistor and the third transistor; and
a second capacitor which is connected between the second connection node and the first output terminal, and
wherein the second negative-resistance circuit comprises:
a fourth transistor of the second conductivity type which includes a fourth current path and a fourth gate electrode, one end of the fourth current path being connected to the third power-supply terminal,
another end of the fourth current path being connected to one end of the second current path of the second transistor;
a third capacitor which is connected between the second input terminal and a third connection node between the second gate electrode of the second transistor and the fourth gate electrode of the fourth transistor;
a second resistor which is connected between the third connection node and a fourth connection node between the second transistor and the fourth transistor; and
a fourth capacitor which is connected between the fourth connection node and the second output terminal.

15. The oscillator circuit according to claim 14, further comprising a current source which is connected to the first interconnect, and supplies a constant current to the first and second negative-resistance circuit in accordance with a control signal.

16. The circuit according to claim 15, further comprising a filter which is connected to the current source, and eliminates noise contained in the control signal.

17. The oscillator circuit according to claim 16, wherein the current source comprises a fifth transistor of the second conductivity type which includes a fifth current path and a fifth gate electrode, one end of the fifth current path being connected to the first interconnect, and
wherein the filter comprises:
a sixth transistor of the second conductivity type which includes a sixth current path and a sixth gate electrode, one end of the sixth current path being connected to the fifth gate electrode of the fifth transistor, and
a fifth capacitor which is connected between the fifth gate electrode of the fifth transistor and another end of the fifth current path of the fifth transistor.

18. The oscillator circuit according to claim 17, further comprising a switch which is connected to the filter, and turns off the filter at time of starting the oscillator circuit.

* * * * *